(12) United States Patent
Kwong et al.

(10) Patent No.: US 7,385,470 B2
(45) Date of Patent: Jun. 10, 2008

(54) TECHNIQUE FOR REDUCING VIA CAPACITANCE

(75) Inventors: Herman Kwong, Kanata (CA); Larry Marcanti, Allen, TX (US); Aneta Wyrzykowska, Dunrobin (CA); Kah Ming Soh, Kanata (CA)

(73) Assignee: Nortel Networks Limited, St. Laurent, Ontario (CA)

( * ) Notice: Subject to any disclaimer, the term of this patent is extended or adjusted under 35 U.S.C. 154(b) by 0 days.

(21) Appl. No.: 11/723,851

(22) Filed: Mar. 22, 2007

(65) Prior Publication Data

US 2007/0169961 A1    Jul. 26, 2007

Related U.S. Application Data

(62) Division of application No. 11/012,127, filed on Dec. 16, 2004, now Pat. No. 7,204,018.

(51) Int. Cl.
*H03H 7/38* (2006.01)
(52) U.S. Cl. .................. 333/260; 333/33; 174/250
(58) Field of Classification Search .............. 333/160, 333/254, 33; 174/250, 261, 265, 266
See application file for complete search history.

(56) References Cited

U.S. PATENT DOCUMENTS

| | | | | | |
|---|---|---|---|---|---|
| 4,543,715 | A | * | 10/1985 | Iadarola et al. | 29/852 |
| 5,359,767 | A | * | 11/1994 | Chen et al. | 29/830 |
| 6,891,272 | B1 | * | 5/2005 | Fjelstad et al. | 257/774 |

* cited by examiner

*Primary Examiner*—Stephen E Jones
(74) *Attorney, Agent, or Firm*—Hunton & Williams LLP

(57) ABSTRACT

A technique for reducing via capacitance is disclosed. In one particular exemplary embodiment, the technique may be realized as a method for reducing via capacitance. The method may comprise forming, in a circuit board, a via hole that bridges a first trace and a second trace. The method may also comprise forming a channel in a sidewall of the via hole. The method may further comprise filling the via hole and the channel with a conductive material. The method may additionally comprise removing the conductive material from the via hole without depleting the channel, thereby forming an interconnect that couples the first trace to the second trace.

14 Claims, 11 Drawing Sheets

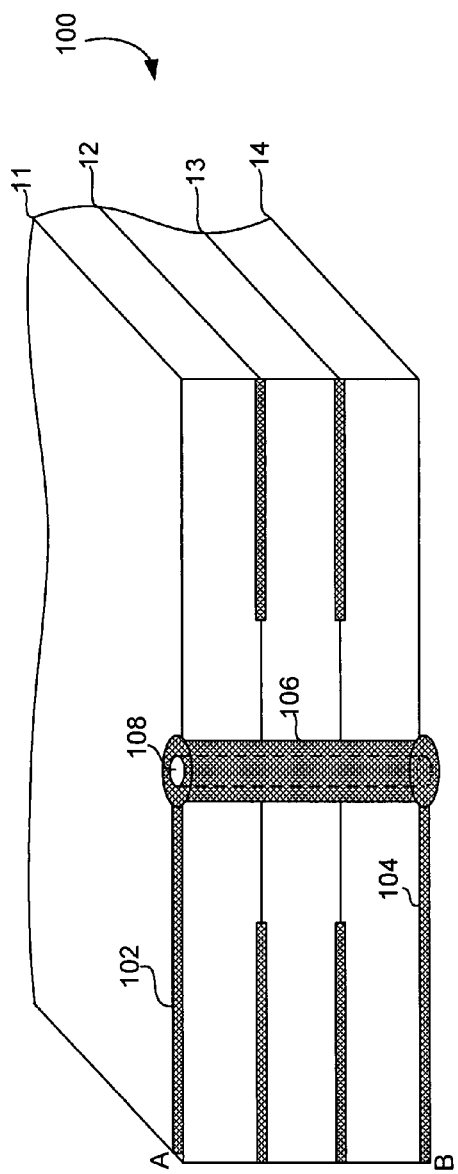
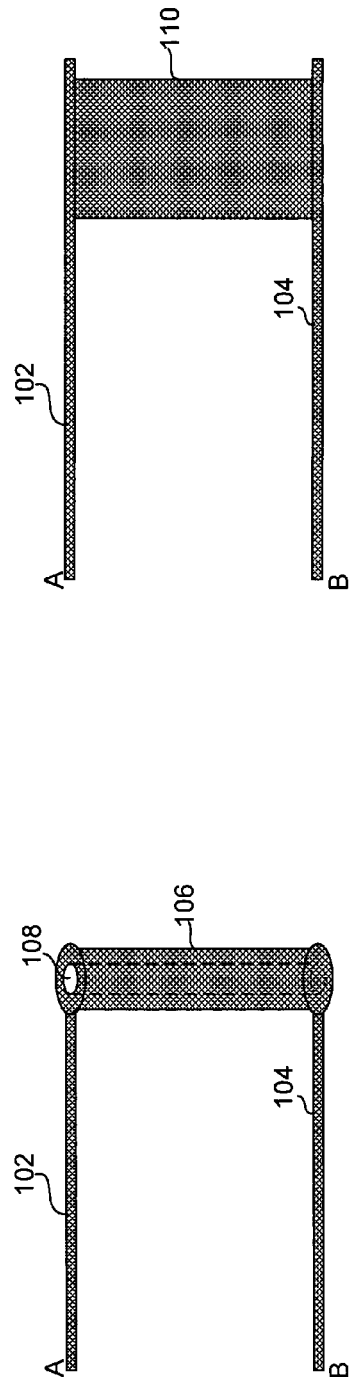
FIG. 1 (Prior Art)
FIG. 2 (Prior Art)
FIG. 3 (Prior Art)

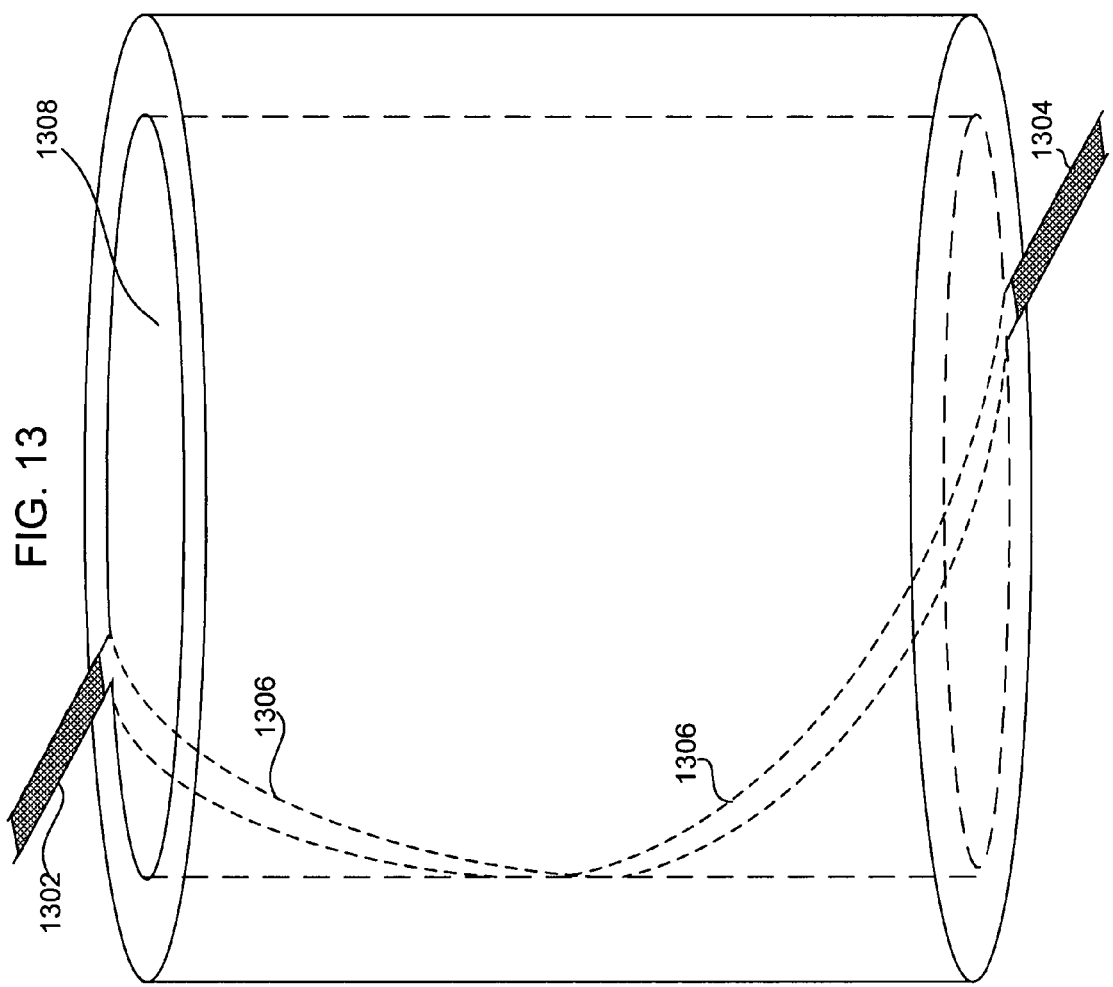

TECHNIQUE FOR REDUCING VIA CAPACITANCE

CROSS-REFERENCE TO RELATED APPLICATIONS

This patent application is a divisional of U.S. patent application Ser. No. 11/012,127, filed Dec. 16, 2004, now U.S. Pat. No. 7,204,018 which is hereby incorporated by reference herein in its entirety.

FIELD OF THE DISCLOSURE

The present disclosure relates generally to microelectronics and, more particularly, to a technique for reducing via capacitance.

BACKGROUND OF THE DISCLOSURE

Most modern electronic equipment rely on circuit boards to route signals among electronic components. A circuit board is typically made of a non-conductive base material. Conductive traces may be printed on the circuit board to couple one electronic component to another. A circuit board may have multiple layers and/or be double-sided so that more components may be packed in a relatively small space. For multi-layered and/or double-sided circuit boards, it is often necessary to create small holes, known as vias, to accommodate electrical connections among different layers or between two sides of the circuit board.

In a circuit board hosting a high data rate circuit, the vias can cause signal integrity problems. FIGS. 1-3 illustrate how a conventional via in a circuit board may be problematic for high data rate transmissions.

FIG. 1 shows a cross-section of a circuit board 100 having a first layer 11, a second layer 12, a third layer 13, and a fourth layer 14. A first trace 102 is formed on the first layer 11 and a second trace 104 is formed on the fourth layer 14. A conventional via interconnect 106 electrically couples the first trace 102 to the second trace 104. The via interconnect 106 may be formed by drilling a through hole 108 from the first layer 11 to the fourth layer 14. The through hole 108 may then be electroplated with a conductive material, typically a metal (e.g., copper). The resulting barrel-shaped via interconnect 106 is also known as a plated through hole (PTH) interconnect.

FIG. 2 is an isolated view of the first trace 102 and the second trace 104 electrically coupled together by the via interconnect 106. The first trace 102, the via interconnect 106, and the second trace 104 form an equivalent path for signal transmissions between point A and point B. If the via interconnect 106 is unfolded, a metal sheet 110, as shown in FIG. 3, may be obtained.

As shown in FIG. 3, the via interconnect 106 (i.e., the metal sheet 110) has a large physical dimension relative to the first trace 102 and the second trace 104. As a result, the via interconnect 106 tends to create excessive capacitance, resulting in an impedance discontinuity in the transmission line between point A and point B. That is, an electrical signal may experience an impedance drop in the via part of the transmission line. This impedance discontinuity may not be a problem for low data rate transmissions. However, at a high data rate, signal integrity may be adversely affected. Further, if a transmission line stitches through a circuit board multiple times passing through several vias, this signal integrity problem may be exacerbated.

In view of the foregoing, it would be desirable to provide a technique for reducing via capacitance which overcomes the above-described inadequacies and shortcomings.

SUMMARY OF THE DISCLOSURE

A technique for reducing via capacitance is disclosed. In one particular exemplary embodiment, the technique may be realized as a method for reducing via capacitance. The method may comprise forming, in a circuit board, a via hole that bridges a first trace and a second trace. The method may also comprise forming a channel in a sidewall of the via hole. The method may further comprise filling the via hole and the channel with a conductive material. The method may additionally comprise removing the conductive material from the via hole without depleting the channel, thereby forming an interconnect that couples the first trace to the second trace.

In accordance with other aspects of this particular exemplary embodiment, the first trace and the second trace may be made of a material that is substantially similar to the conductive material. And a physical dimension of the channel may be substantially similar to a physical dimension of the first trace and the second trace.

In accordance with further aspects of this particular exemplary embodiment, the circuit board may comprise multiple layers, and the first trace and the second trace may be located on different layers of the circuit board.

In accordance with additional aspects of this particular exemplary embodiment, the circuit board may be double-sided, the first trace may be located on a first side of the circuit board, and the second trace may be located on a second side of the circuit board.

In accordance with another aspect of this particular exemplary embodiment, the channel may be a straight channel that substantially parallels a central axis of the via hole. Alternatively, the channel may be a helical channel that spirals around a central axis of the via hole.

In accordance with another aspect of this particular exemplary embodiment, the step of filling may comprise completely filling the via hole with the conductive material or partially filling the via hole with the conductive material.

In accordance with yet another aspect of this particular exemplary embodiment, the method may comprise filling the via hole with a dielectric material after the interconnect is formed.

In another particular exemplary embodiment, the technique may be realized as a method for reducing via capacitance. The method may comprise forming a via hole in a circuit board, wherein the via hole bridges a first trace and a second trace, and wherein the via hole bridges a third trace and a fourth trace. The method may also comprise forming a first channel in a sidewall of the via hole. The method may further comprise forming a second channel in the sidewall of the via hole. The method may additionally comprise filling the via hole, the first channel, and the second channel with a conductive material. And the method may comprise removing the conductive material from the via hole without depleting the first channel or the second channel, thereby forming a first interconnect that couples the first trace to the second trace and a second interconnect that couples the third trace to the fourth trace.

In accordance with other aspects of this particular exemplary embodiment, a physical dimension of the first channel may be substantially similar to a physical dimension of the second channel, such that the first interconnect and second interconnect have matching electrical characteristics.

In accordance with further aspects of this particular exemplary embodiment, the step of filling may comprise completely filling the via hole with the conductive material or partially filling the via hole with the conductive material.

In yet another particular exemplary embodiment, the technique may be realized by a circuit board with reduced via capacitance. The circuit board may comprise a first trace. The circuit board may also comprise a second trace. The circuit board may further comprise a via hole that bridges the first trace and the second trace. The circuit board may additionally comprise an interconnect formed in a sidewall of the via hole, wherein the interconnect couples the first trace to the second trace.

In accordance with other aspects of this particular exemplary embodiment, the first trace and the second trace may be made of a material that is substantially similar to the interconnect. And a physical dimension of the interconnect may be substantially similar to a physical dimension of the first trace and the second trace.

In accordance with further aspects of this particular exemplary embodiment, the circuit board may comprise multiple layers, and the first trace and the second trace may be located on different layers of the circuit board.

In accordance with additional aspects of this particular exemplary embodiment, the circuit board may be double-sided, the first trace may be located on a first side of the circuit board, and the second trace may be located on a second side of the circuit board.

In accordance with another aspect of this particular exemplary embodiment, the interconnect may substantially parallel a central axis of the via hole. Alternatively, the interconnect may spiral around a central axis of the via hole.

In accordance with yet another aspect of this particular exemplary embodiment, the via hole may be filled with a dielectric material.

In accordance with still another aspect of this particular exemplary embodiment, the circuit board may further comprise: a third trace and a fourth trace that are bridged by the via hole; and a second interconnect formed in the sidewall of the via hole, wherein the second interconnect couples the third trace to the fourth trace.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIGS. 1-3 illustrate an impedance discontinuity problem with prior art vias.

FIG. 13 shows a helical-channel configuration in accordance with an embodiment of the present disclosure.

DETAILED DESCRIPTION OF EXEMPLARY EMBODIMENT(S)

According to embodiments of the present disclosure, it may be desirable to interconnect two traces with a structure that matches the electrical characteristics of the traces, such that a signal transmitted through the traces will not experience a significant impedance difference in the interconnect. One exemplary process for creating such an interconnect structure is described below.

FIG. 4-9 illustrate the transformation of a circuit board during the exemplary process.

Figure 4:
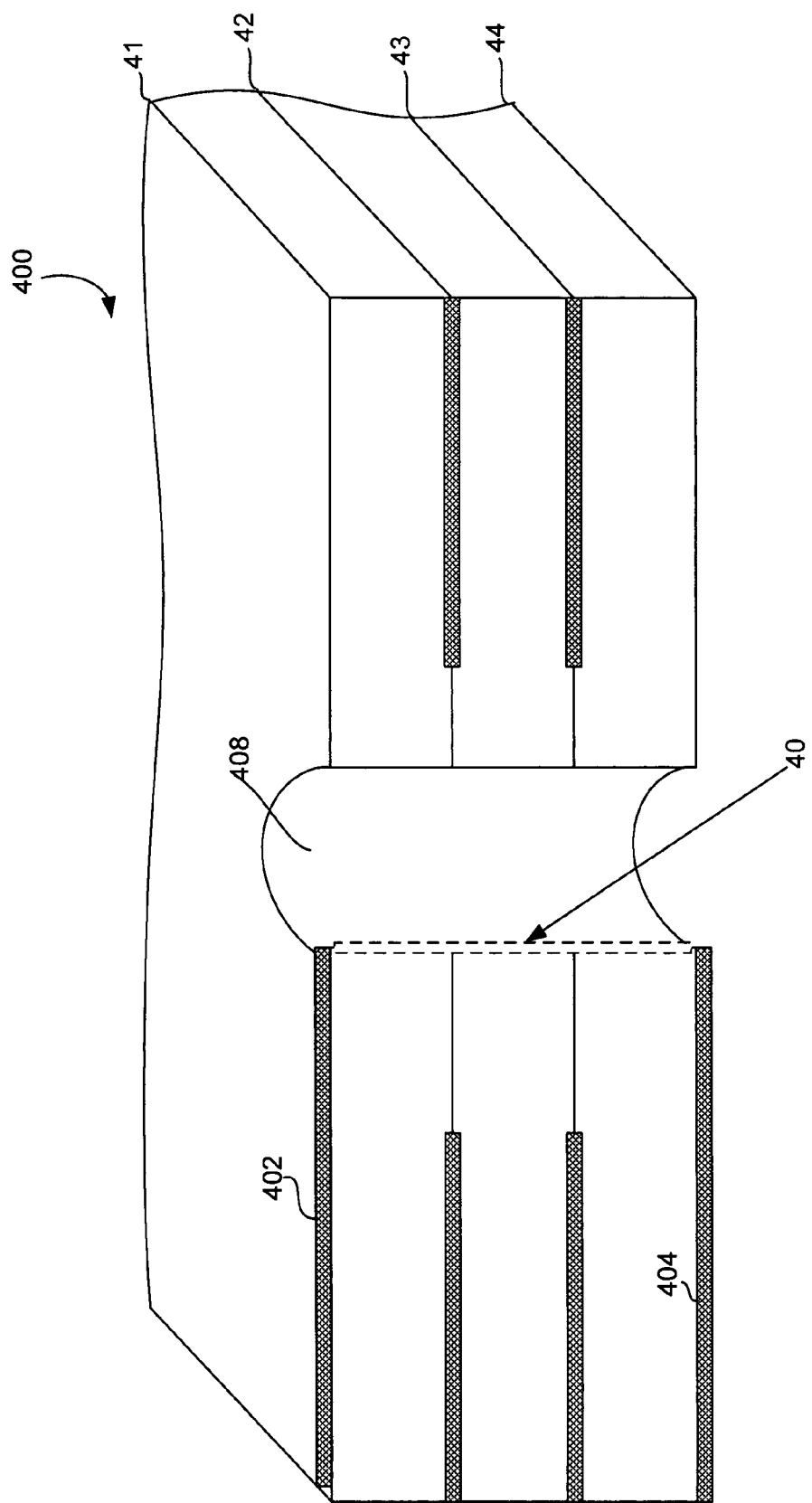
FIG. 4-9 illustrate the transformation of a circuit board in accordance with an embodiment of the present disclosure.

In FIG. 4, there is shown a multi-layered circuit board 400 having a first layer 41, a second layer 42, a third layer 43, and a fourth layer 44. A first trace 402 is formed on the first layer 41 and a second trace 404 is formed on the fourth layer 44. The first trace 402 and the second trace 404 are to be interconnected to form a transmission line that can maintain signal integrity at a high data rate.

First, to accommodate an interconnect, a via hole 408 (partially shown in this cross-sectional view) may be formed to bridge the first trace 402 and the second 404. The via hole 408 may be any conventional type of through hole that spans from the first layer 41 to the fourth layer 44. The via hole 408 may be formed by drilling, etching, or any other known methods. In FIG. 4, a dashed-line box 40 shows an approximate location on a sidewall of the via hole 408 where an interconnect between the first trace 402 and the second trace 404 may be formed.

Figure 5:
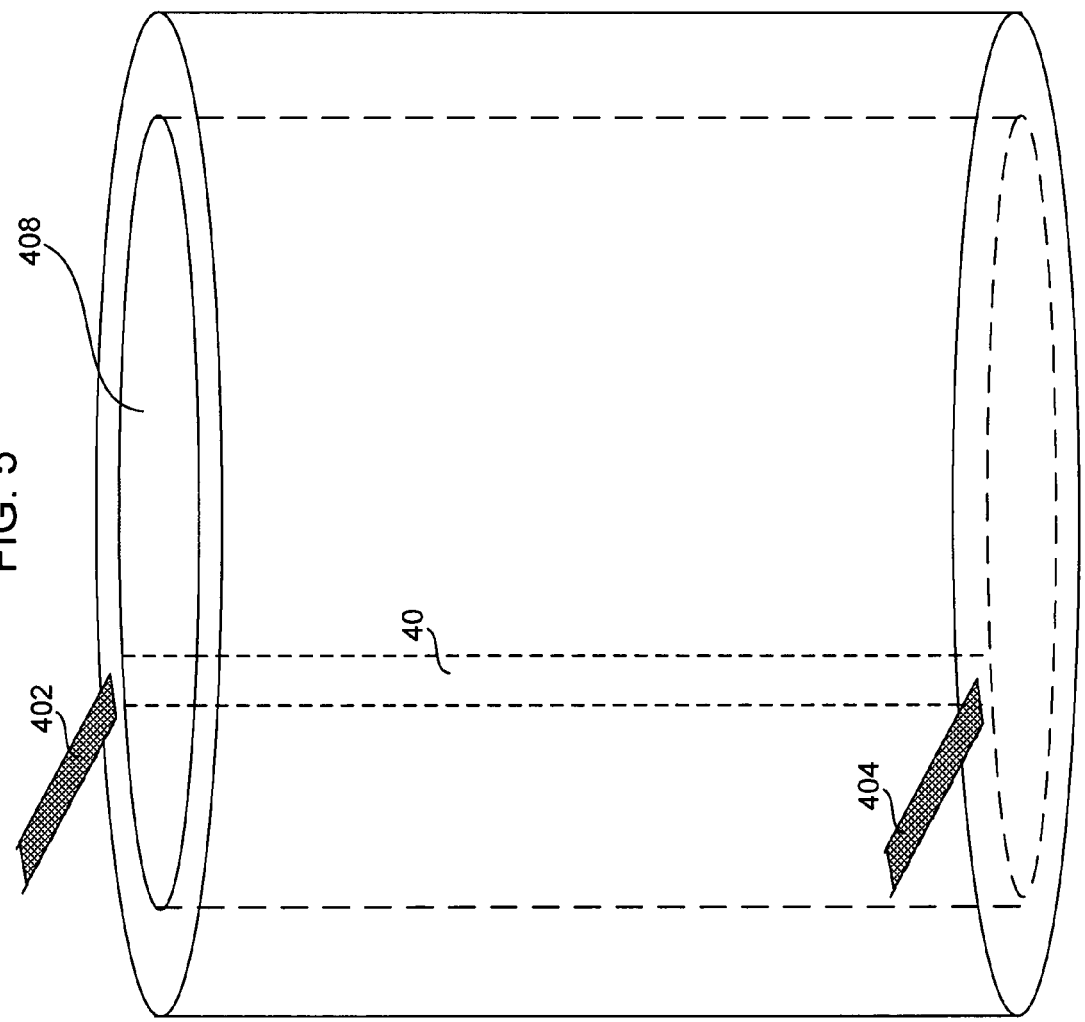

FIG. 5 is a close-up view of the via hole 408. It should be noted that, in practice, the first trace 402 and the second trace 404 may be formed either before or after the interconnect is formed. For clarity of illustration, the first trace 402 and the second trace 404 are shown in FIGS. 4 and 5 as if they have been formed prior to the formation of the interconnect. In FIG. 5, the dashed-line box 40 shows the approximate location on a sidewall of the via hole 408 where an interconnect between the first trace 402 and the second trace 404 may be formed.

Figure 6:
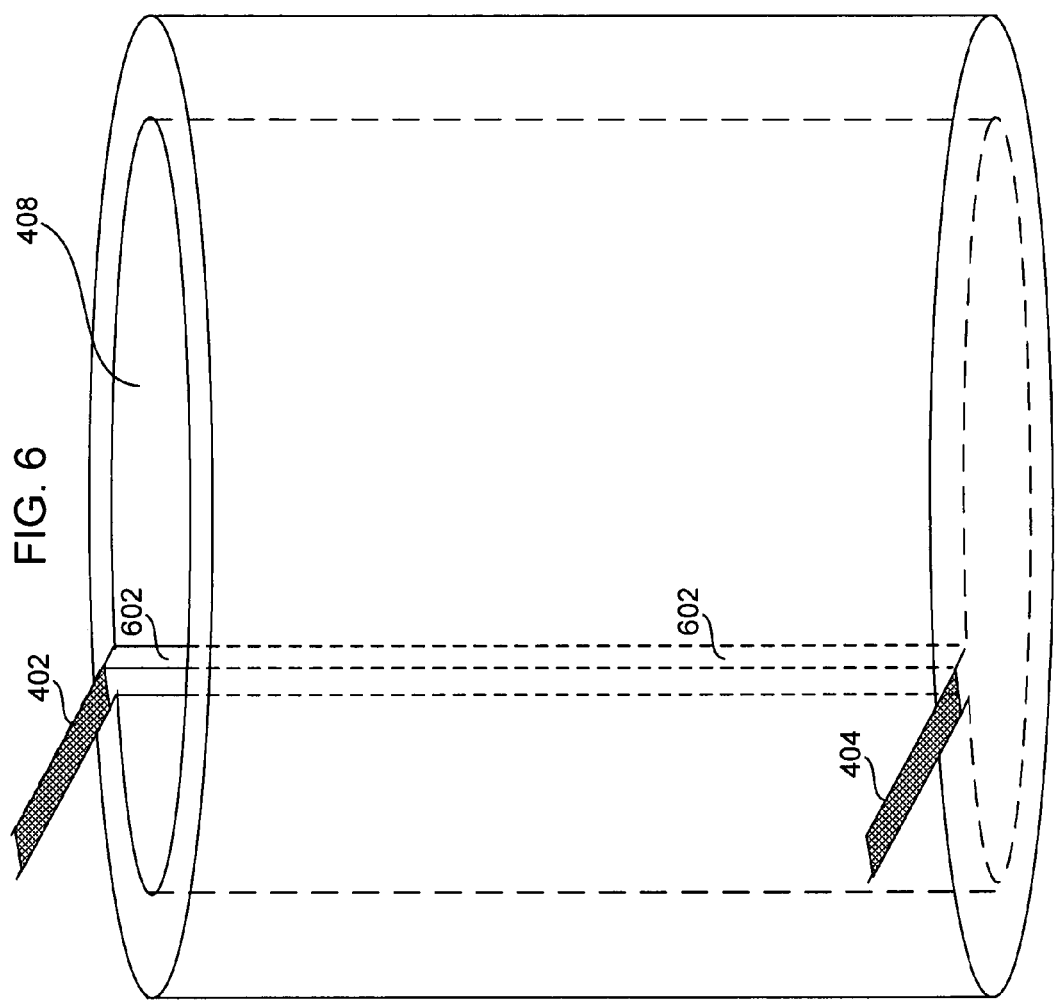

Next, as shown in FIG. 6, a channel 602 may be formed in the sidewall of the via hole 408. FIG. 6 is a close-up view of the via hole 408 after the channel 602 has been formed in the location indicated by the dashed-line box 40 in FIGS. 4 and 5. A number of methods, such as mechanical punch, pneumatic press, plasma etching, laser cutting, or any number of abrasive processes, may be employed to create the channel 602. One end may be in close proximity to the first trace 402, and the other end of the channel 602 may be in close proximity to the second trace 404. The channel 602 may have a physical dimension (e.g., width and depth) that is substantially similar to that of the first and second traces 402 and 404.

Figure 7:
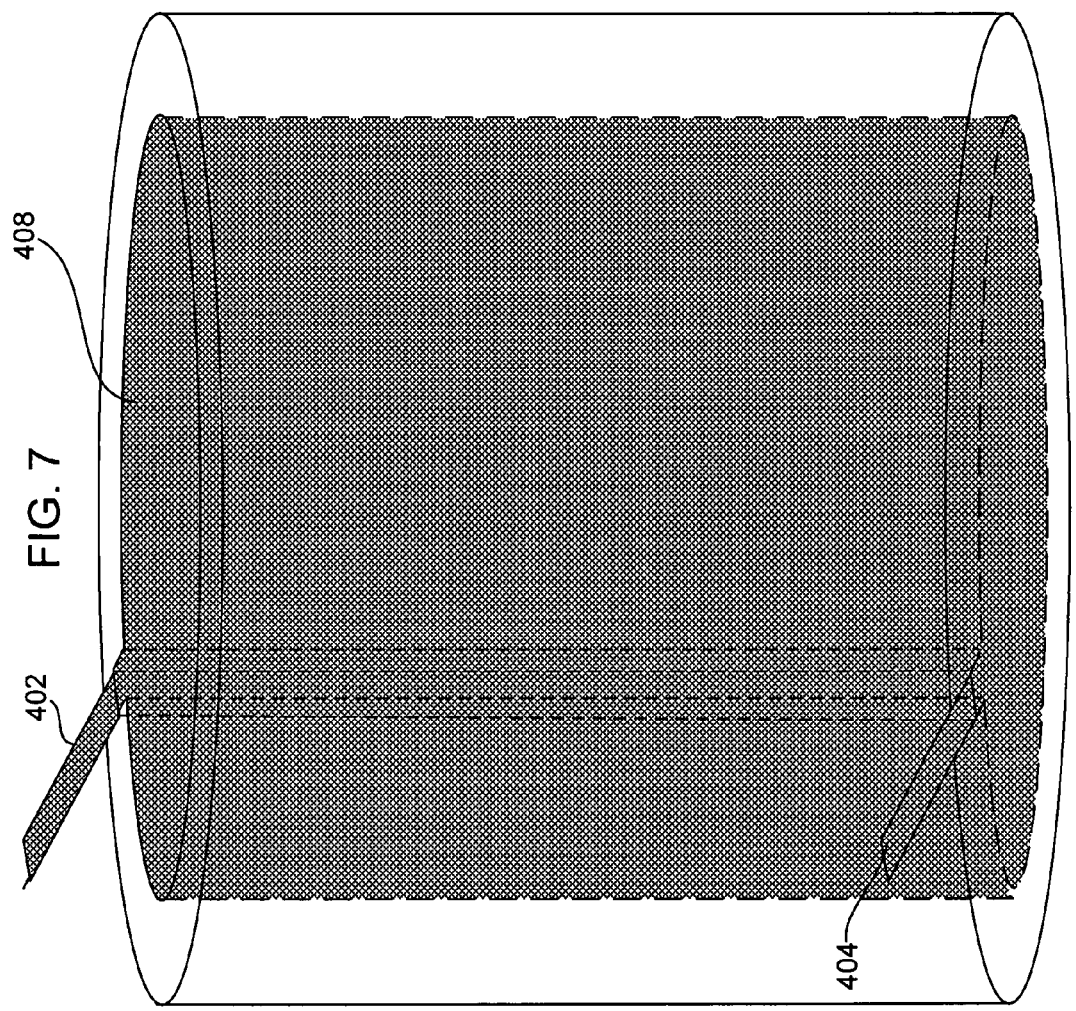

Next, as shown in FIG. 7, the via hole 408 and the channel 602 may be filled with a conductive material such as, for example, a metal. According to one embodiment, the conductive material may be a metal that is same as or similar to the material used to form the first and second traces 402 and 404. Although shown in FIG. 7 as completely filled with the conductive material, the via hole 408 may alternatively be partially filled (e.g., only the sidewalls and channel are covered). The filling may be achieved through a number of known processes such as, for example, electroless plating and electroplating with a metal material. Alternatively, the via hole 408 and the channel 602 may be filled with a conductive paste or polymer.

Figure 8:
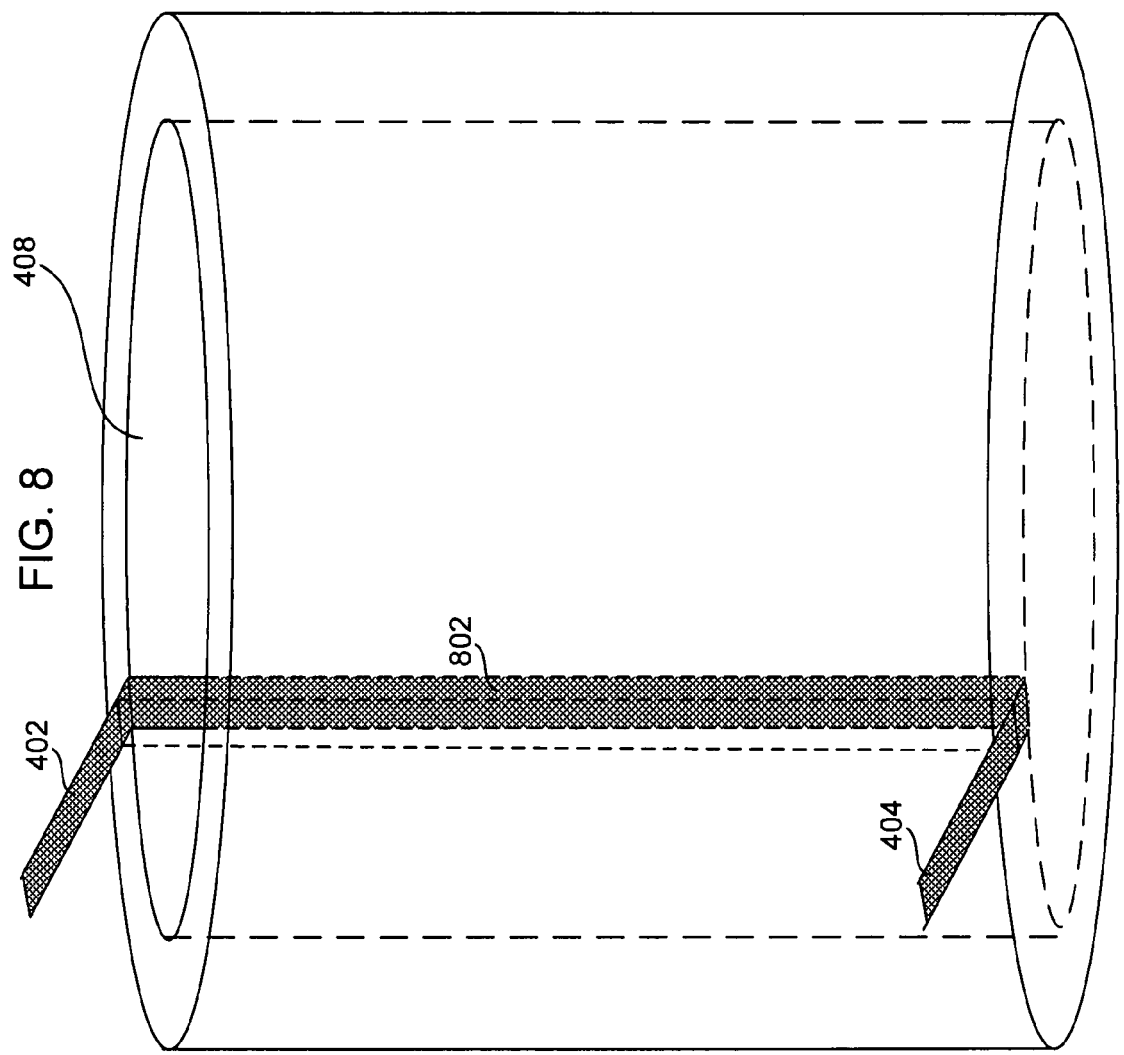

Finally, as shown in FIG. 8, the conductive material may be removed from the via hole 408 without depleting the channel 602. That is, the channel 602 may remain filled with the conductive material, such that there is a conductive interconnect 802 that couples the first trace 402 to the second trace 404.

Figure 9:
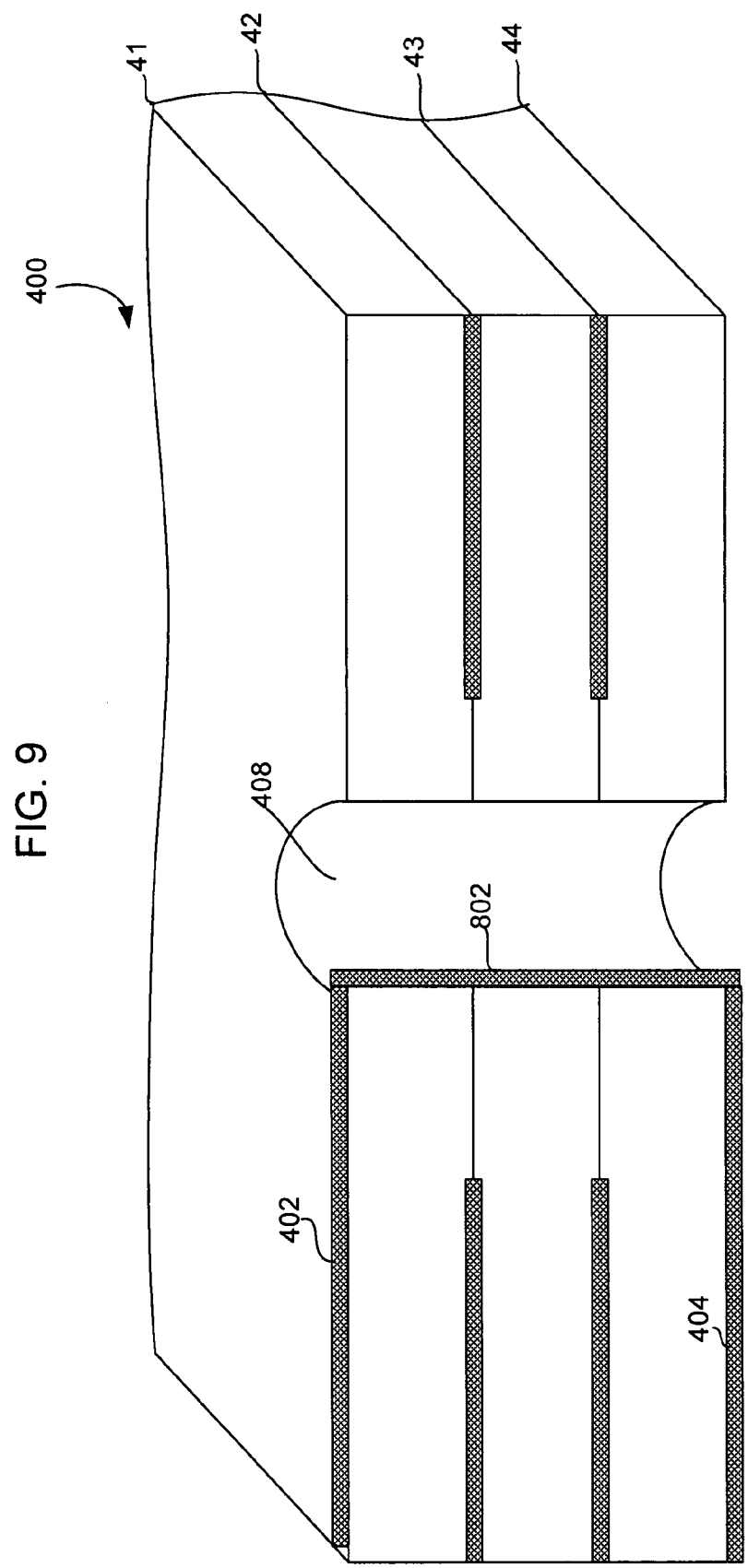

FIG. 9 shows a cross-sectional view of the circuit board 400 after the interconnect 802 has been formed. If the conductive material that forms the interconnect 802 is the same as the conductive material that forms the first and second traces 402 and 404, and the channel 602 has a physical dimension that is similar to the first and second traces 402 and 404, then the interconnect 802 may have the same electrical characteristics as the first and second traces 402 and 404. Thus, a signal traveling from the first trace 402 to the second trace 404 via the interconnect 802 will not experience any significant impedance discontinuity due to the interconnect 802.

According to embodiments of the present disclosure, more than one interconnect may be formed in a single via hole. Two such examples are shown in FIGS. 10-12.

Figure 10:
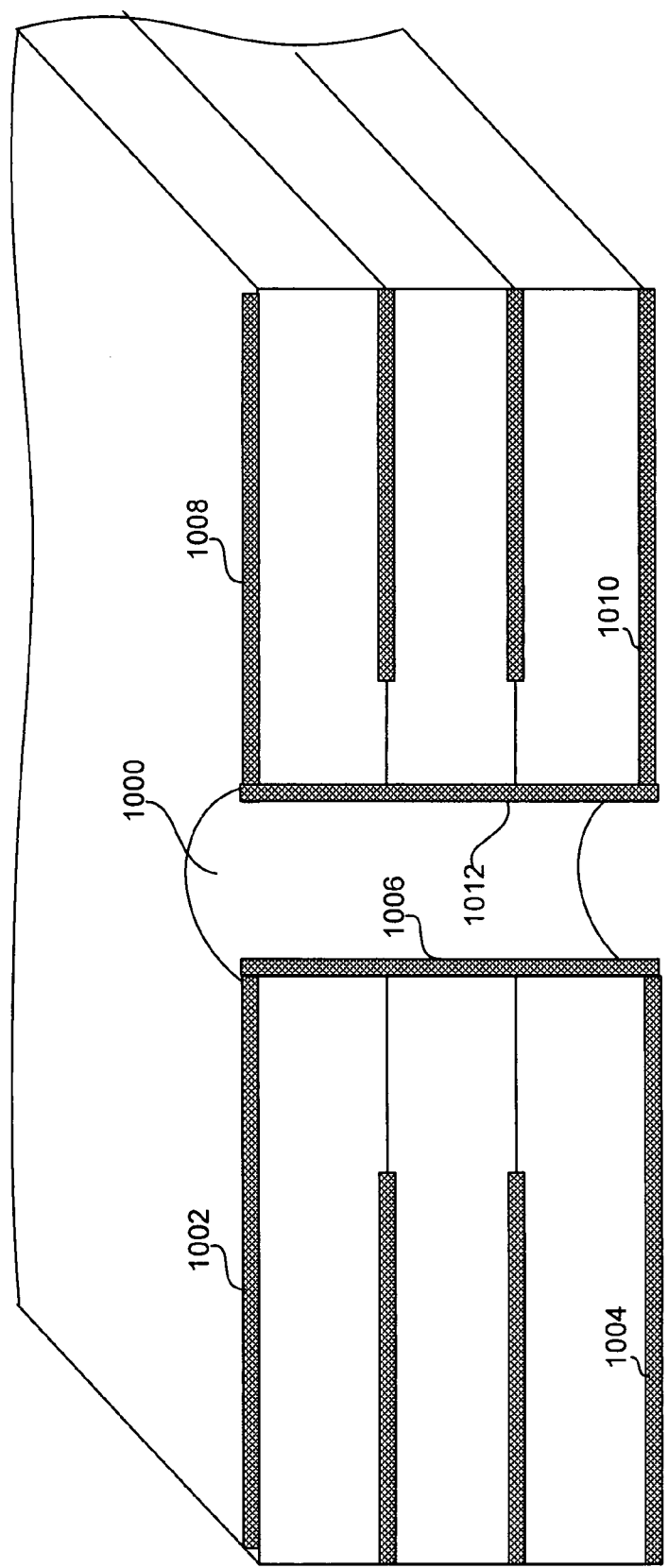
FIG. 10 shows two interconnects formed in a single via hole in accordance with an embodiment of the present disclosure.

FIG. 10 shows two interconnects 1006 and 1012 formed in a single via hole 1000. As shown, a first trace 1002 and a second trace 1004 are coupled together by the interconnect 1006. A third trace 1008 and a fourth trace 1010 are coupled together by an interconnect 1012. The interconnects 1006 and 1012 may be separately or simultaneously formed in the via hole 1000 in a manner as described above.

Figure 11:
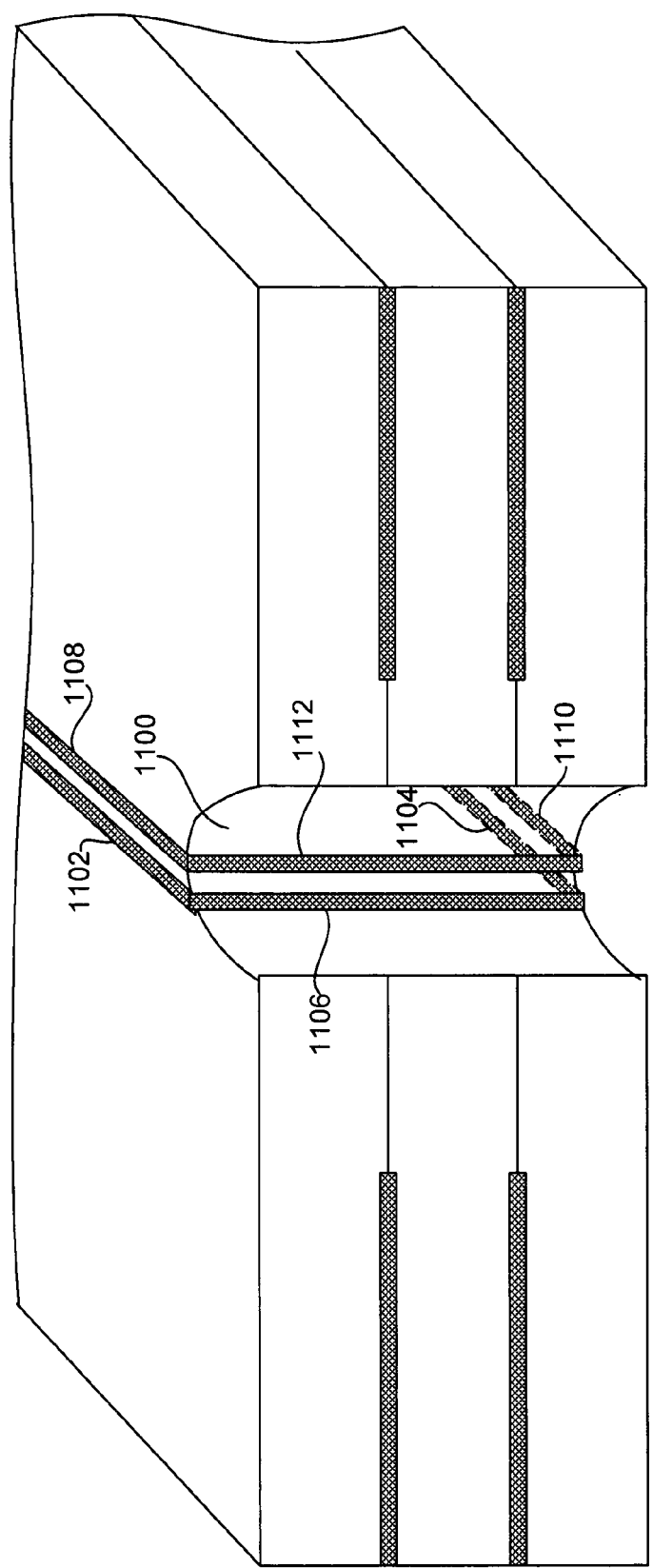
FIG. 11 shows an impedance-matched differential pair in a via hole in accordance with an embodiment of the present disclosure.

FIG. 11 shows an impedance-matched differential pair in a via hole in accordance with an embodiment of the present disclosure. A high performance differential pair circuit typically requires one portion of the circuit to be closely matched with another portion of the circuit. Thus, it may be advantageous to position two matching parts of a differential pair close to one another on a circuit board and subject them to identical fabrication process. FIG. 11 shows two parts of a differential pair circuit being matched in a common via hole 1100. Here, a first trace 1102 and a second trace 1104 are coupled together by an interconnect 1106. A third trace 1108 and a fourth trace 1110 are coupled together by an interconnect 1112. The interconnects 1106 and 1112 may be separately or simultaneously formed in the via hole 1100 in a manner as described above. Therefore, apart from creating no impedance discontinuity, the interconnects 1106 and 1112 have matching impedances to satisfy the requirements of the differential pair circuit. Note that the first trace 1102 and the third trace 1108 are placed close to each other, and the second trace 1104 and the fourth trace 1110 are placed close to each other.

Figure 12:
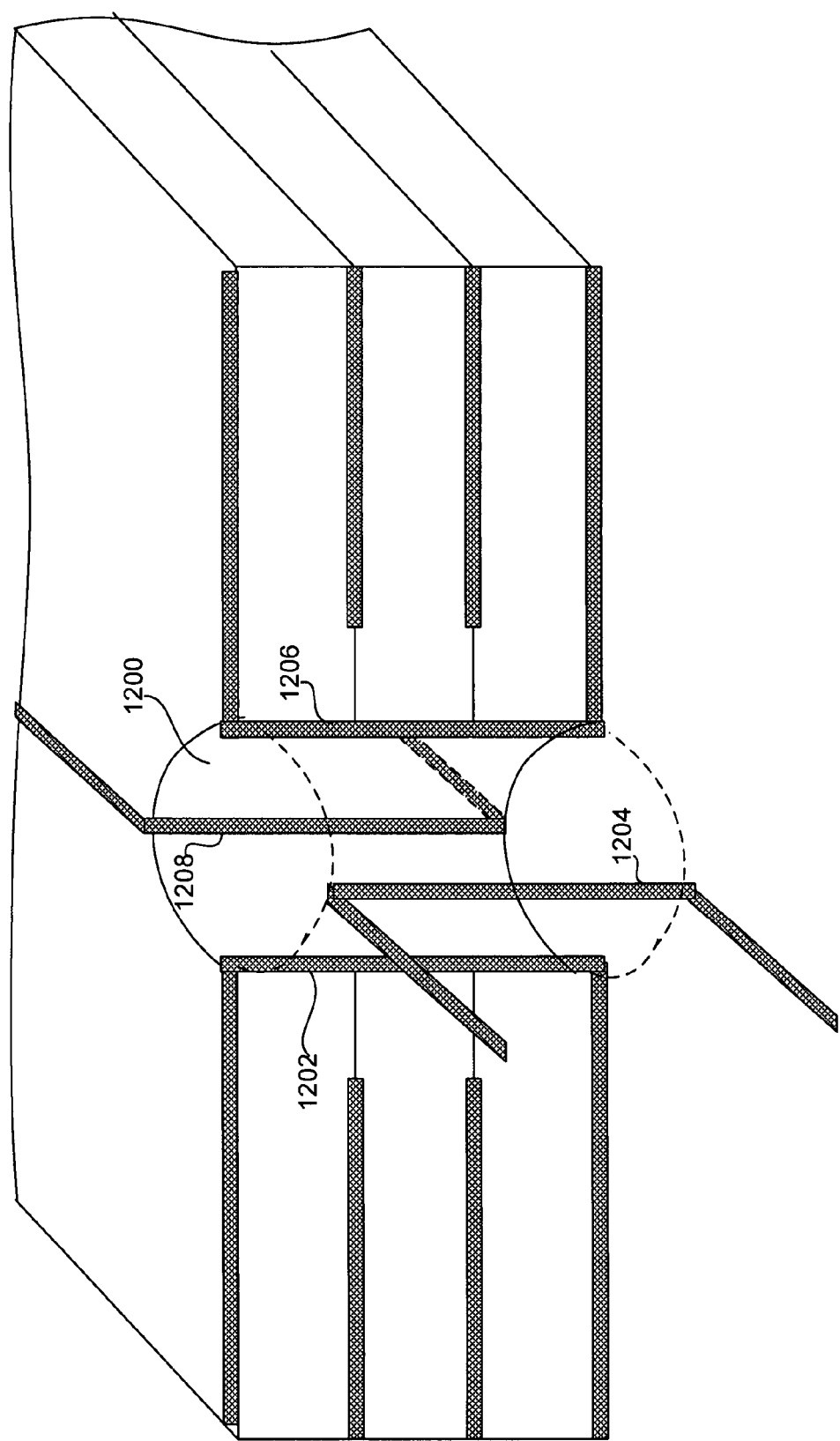
FIG. 12 shows four interconnects formed in a single via hole in accordance with an embodiment of the present disclosure.

FIG. 12 shows four interconnects formed in a single via hole in accordance with an embodiment of the present disclosure. In this example, four interconnects (1202, 1204, 1206, and 1208) are formed in a single via hole 1200. The four interconnects may be separately or simultaneously formed in the via hole 1200 in a manner as described above. Since the via hole 1200 now accommodates four, rather than one or two, interconnects, its diameter may be increased so that the interconnects will not be too close to one another in violation of design rules associated with wire spacing.

According to embodiments of the present disclosure, the orientation of a channel and its route in a sidewall of a via hole may vary depending on the relative locations of two or more traces to be interconnected. In the example described above, the relative locations of the first and second traces 402 and 404 seem to favor a straight channel 602 (hence a straight interconnect 802) that runs along a central axis of the via hole 408. In other scenarios, where two or more traces are not located to permit a straight interconnect, one or more of the traces may be re-routed. Alternatively, other shapes of the channel (and interconnect) may be used. One such example is shown in FIG. 13.

FIG. 13 shows a helical-channel configuration in accordance with an embodiment of the present disclosure. In this example, a first trace 1302 and a second trace 1304 are to be interconnected. After a via hole 1308 is drilled, the first trace 1302 and the second trace 1304 may be on opposite sides of the via hole 1308. In this case, a helical-shaped channel 1306 may be formed in a sidewall of the via hole 1308 with, for example, a screw-drilling process. Then, after a metallization process is performed on the via hole 1308, excess metal may be removed, so that the helical-shaped channel 1306 may remain filled with conductive material to create a helical-shaped interconnect.

Although, in the exemplary embodiments described above, the traces to be interconnected appear to be on surface layers of a circuit board, both of them do not have to be on a surface layer. For example, one trace may be on a surface layer while the other may be on either an internal layer or a surface layer of the circuit board. Further, if the circuit board is manufactured one layer at a time, for example, the method for reducing via capacitance as described above may be employed to interconnect two traces that are both on internal layers.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. A circuit board with reduced via capacitance, the circuit board comprising:
   a first electrically conductive trace;
   a second electrically conductive trace;
   a via hole having a sidewall channel formed therein that bridges the first trace and the second trace; and
   an electrically conductive interconnect formed in the sidewall channel of the via hole, wherein the electrically conductive interconnect spirals around a central axis of the via hole to electrically couple the first electrically conductive trace to the second electrically conductive trace.

2. The circuit board according to claim 1, wherein:
the circuit board comprises multiple layers; and
the first electrically conductive trace and the second electrically conductive trace are located on different layers of the circuit board.

3. The circuit board according to claim 1, wherein:
the circuit board is double-sided;
the first electrically conductive trace is located on a first side of the circuit board; and
the second electrically conductive trace is located on a second side of the circuit board.

4. The circuit board according to claim 1, wherein the first electrically conductive trace and the second electrically conductive trace are disposed in different side locations of the via hole.

5. The circuit board according to claim 1, wherein the via hole is filled with a dielectric material.

6. The circuit board according to claim 1, wherein the first electrically conductive trace and the second electrically conductive trace are made of a material that is similar to the electrically conductive interconnect to insure impedance continuity for a signal traveling from the first electrically conductive trace to the second electrically conductive trace via the electrically conductive interconnect.

7. The circuit board according to claim 6, wherein a physical dimension of the electrically conductive interconnect is similar to a physical dimension of the first electrically conductive trace and the second electrically conductive trace to insure impedance continuity for a signal traveling from the first electrically conductive trace to the second electrically conductive trace via the electrically conductive interconnect.

8. The circuit board according to claim 1, wherein a physical dimension of the electrically conductive interconnect is similar to a physical dimension of the first electrically conductive trace and the second electrically conductive trace to insure impedance continuity for a signal traveling from the first electrically conductive trace to the second electrically conductive trace via the electrically conductive interconnect.

9. The circuit board according to claim 8, wherein the first electrically conductive trace and the second electrically conductive trace are made of a material that is similar to the electrically conductive interconnect to insure impedance continuity for a signal traveling from the first electrically conductive trace to the second electrically conductive trace via the electrically conductive interconnect.

10. The circuit board according to claim 1, further comprising:
a third electrically conductive trace and a fourth electrically conductive trace that are bridged by a second sidewall channel formed in the via hole; and
a second electrically conductive interconnect formed in the sidewall channel of the via hole, wherein the second electrically conductive interconnect electrically couples the third electrically conductive trace to the fourth electrically conductive trace.

11. The circuit board according to claim 10, wherein the first electrically conductive trace, the second electrically conductive trace, and the electrically conductive interconnect form a first signal path, wherein the third electrically conductive trace, the fourth electrically conductive trace, and the second electrically conductive interconnect form a second signal path, and wherein the first signal path and the second signal path are arranged to form a differential signal path.

12. The circuit board according to claim 11, wherein the first signal path and the second signal path are formed of similar materials to insure impedance continuity within the first signal path and the second signal path and matching impedance between the first signal path and the second signal path for the differential signal path.

13. A circuit board with reduced via capacitance, the circuit board comprising:
a first electrically conductive trace;
a second electrically conductive trace;
a via hole that bridges the first electrically conductive trace and the second electrically conductive trace; and
an electrically conductive interconnect formed in a sidewall of the via hole, wherein the electrically conductive interconnect spirals around a central axis of the via hole to electrically couple the first electrically conductive trace to the second electrically conductive trace.

14. A circuit board with reduced via capacitance, the circuit board comprising:
a first electrically conductive trace;
a second electrically conductive trace;
a via hole that bridges the first electrically conductive trace and the second electrically conductive trace, wherein the first electrically conductive trace and the second electrically conductive trace are disposed in different side locations of the via hole; and
an electrically conductive interconnect formed in a sidewall of the via hole, wherein the electrically conductive interconnect curves around a central axis of the via hole to electrically couple the first electrically conductive trace to the second electrically conductive trace.

* * * * *